United States Patent

Harwood et al.

[11] Patent Number: 4,464,633
[45] Date of Patent: Aug. 7, 1984

[54] AMPLIFIER INCORPORATING GAIN DISTRIBUTION CONTROL FOR CASCADED AMPLIFYING STAGES

[75] Inventors: Leopold A. Harwood, Bridgewater, N.J.; Robert L. Shanley, II, Indianapolis, Ind.

[73] Assignee: RCA Corporation, N.Y.

[21] Appl. No.: 363,869

[22] Filed: Mar. 31, 1982

[51] Int. Cl.³ .................................................. H03G 3/30
[52] U.S. Cl. ...................................... 330/254; 330/133; 330/278
[58] Field of Search ..................... 330/133, 254, 278; 358/27, 40, 174, 176; 455/232, 241; 307/540, 552

[56] References Cited

U.S. PATENT DOCUMENTS 3,676,789  7/1972  Bray ..................................... 330/254
4,051,519  9/1977  Harwood ............................. 358/21

OTHER PUBLICATIONS

Davis, *Industrial Electronics: Design and Application*, published 1973 by Bell and Howell Co., p. 207.
Millman et al., *Integrated Electronics: Analog and Digital Circuits and Systems*, published 1972 by McGraw-Hill Co., p. 515.

*Primary Examiner*—James B. Mullins
*Attorney, Agent, or Firm*—Eugene M. Whitacre; Paul J. Rasmussen; William H. Meagher

[57] ABSTRACT

A pair of differential amplifier stages are connected in cascade to form a multistage amplifier for signal amplification purposes. The base-emitter paths of current source transistors which establish the operating currents for the respective stages are connected in series across a common source of forward bias voltage. The collector-emitter path of an additional transistor is shunted across the base-emitter path of one of the current source transistors. As biasing of the additional transistor is varied, the distribution of gain between the respective cascaded stages is altered substantially without disturbance of the overall gain of the multistage amplifier.

10 Claims, 1 Drawing Figure

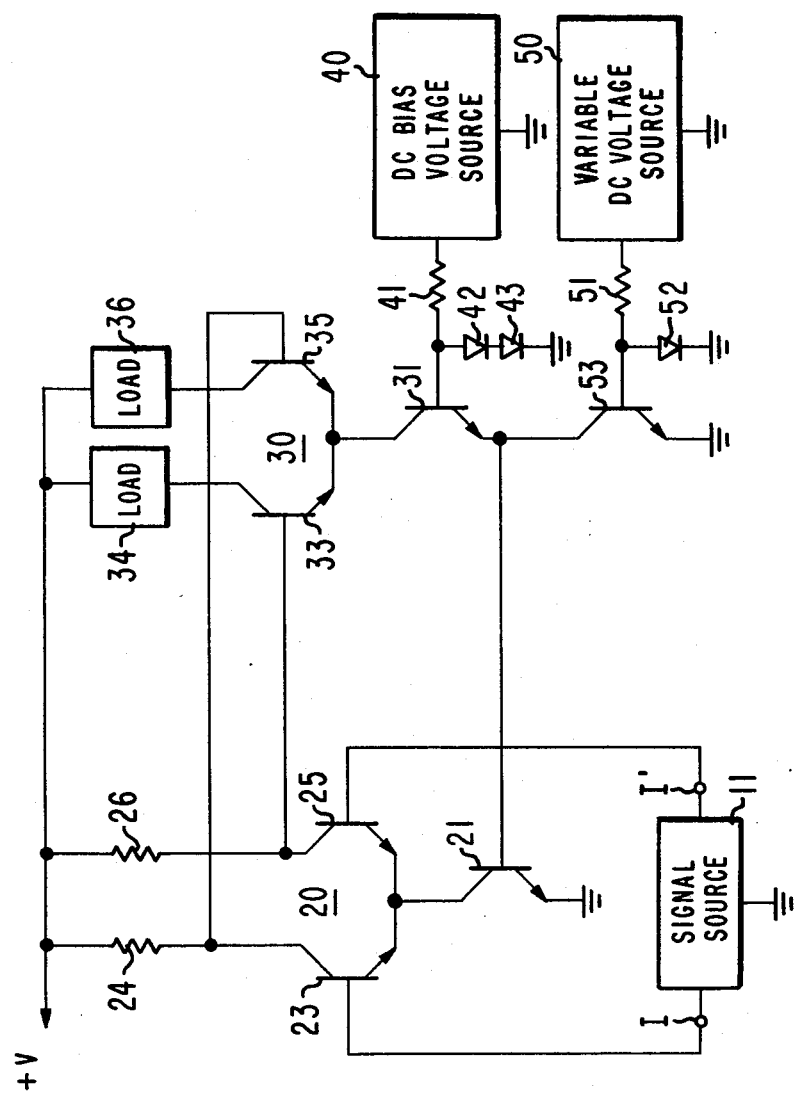

AMPLIFIER INCORPORATING GAIN DISTRIBUTION CONTROL FOR CASCADED AMPLIFYING STAGES

The present invention relates generally to amplifiers employing cascaded amplifying stages, and particularly to novel forms of such amplifiers incorporating a facility for altering the distribution of gain among the cascaded amplifying stages.

In accordance with the principles of the present invention, a gain control means is associated with first and second amplifying stages of an amplifier, which stages are connected in cascade for signal amplification purposes. The gain control means simultaneously adjusts the respective gains of the first and second amplifying stages in mutually opposite directions, with the respective gain adjustments so related in magnitude that the distribution of gain between the stages is altered substantially without disturbance of the overall gain of the amplifier.

In accordance with an illustrative embodiment of the invention, each of the gain controlled amplifying stages includes a pair of transistors disposed in a differential amplifier configuration, with interconnected emitter electrodes linked to the collector electrode of a current source transistor. The base-emitter paths of the current source transistors for the respective stages are connected in series across a common bias source. A variable DC impedance is connected in shunt with the base-emitter path of one of the current source transistors. Variations of the shunt impedance introduce complementary variations of the $V_{be}$ voltages of the respective current source transistors, with consequent complementary variations of the gains of the respective stages. As the distribution of gain between the respective stages is thereby altered, the overall gain of the amplifier remains essentially constant, and independent of the impedance variations.

Illustratively, the variable DC impedance comprises the collector-emitter path of an additional transistor. A variable biasing current is supplied to the base-emitter path of the additional transistor to alter the conductance of the additional transistor's collector-emitter path.

An illustrative application of the present invention is in achievement of adjustable coring of a signal, as disclosed, for example, in our copending U.S. patent application, Ser. No. 363,868, entitled "Adjustable Coring Circuit" and concurrently filed herewith, now abandoned in favor of continuation-in-part application Ser. No. 460,985, filed Jan. 25, 1983. In such a coring circuit arrangement, a signal to be cored is applied to the input of a linear amplifier, and to the input of a limiting amplifier, with the outputs of the respective amplifiers combined in an anti-phasal relationship to develop the cored signal. The limiting amplifier includes a pair of cascaded amplifying stages subject to gain distribution control in the manner described herein. As the distribution of gain between the stages is varied, the level of coring effected by the circuit is altered. The maintenance of the overall gain of the limiting amplifier is substantially constant, and, in this instance, suitably matched to the gain of the linear amplifier, in the presence of the gain distribution variations, assures one of the integrity of the coring action at all selected coring levels.

Other examples of application of the present invention are also considered herein, such as use thereof in systems for automatic gain control of the IF amplifier of a television receiver and use thereof in conjunction with systems for automatic and manual control of the gain of the chrominance channel of a color television receiver.

In the drawing, the sole FIGURE illustrates, partially schematically and partially by block representation, an amplifier embodying the principles of the present invention.

In the illustrated embodiment, the input stage of a multistage signal amplifier comprises a first differential amplifier 20, employing a pair of NPN transistors 23,25 with interconnected emitter electrodes. The base electrodes of transistors 23 and 25 are connected respectively to terminals I and I' of a signal source 11, so that a signal representative of the difference between the potentials appearing at signal source terminals I,I' is subject to amplification by amplifier 20. Oppositely phased versions of the amplified signal appear across respective load resistors 24,26, respectively connected between the positive terminal (+V) of an operating potential supply and the respective collector electrodes of transistors 23 and 25. The operating current of amplifier 20 is determined by the biasing of an NPN current source transistor 21, disposed with its collector electrode directly connected to the interconnected emitter electrodes of transistors 23 and 25, and its emitter electrode returned directly to the negative terminal (e.g., ground) of the operating potential supply.

The output stage of the illustrated multistage signal amplifier comprises a second differential amplifier 30, coupled in cascade with the first differential amplifier 20. Differential amplifier 30 employs a pair of NPN transistors 33,35 with interconnected emitter electrodes. The base electrodes of transistors 33 and 35 are connected to the collector electrodes of transistors 25 and 23, respectively, so as to be responsive to respective outputs of differential amplifier 20. An output of the multistage amplifier appears across a load 34 connected between the +V terminal and the collector electrode of transistor 33. An oppositely phased output of the multistage amplifier appears across a load 36 connected between the +V terminal and the collector electrode of transistor 35. The operating current of amplifier 30 is determined by the biasing of an NPN current source transistor 31, disposed with its collector electrode directly connected to the interconnected emitter electrodes, and its emitter electrode directly connected to the base electrode of current source transistor 21.

In order to forward bias the base-emitter junctions of the current source transistors 31,21, the positive terminal of a DC bias voltage source 40 is connected via a resistor 41 to the base electrode of transistor 31, with the junction of resistor 41 and transistor 31 base returned to the grounded negative terminal of source 40 via the series combination of a pair of diodes 42,43 poled so as to be forward biased by the bias voltage source 40.

An additional NPN transistor 53 is disposed with its collector electrode directly connected to the base electrode of transistor 21, and its emitter electrode directly connected to the grounded emitter electrode of transistor 21, thus placing its collector-emitter path in shunt with the base-emitter path of current source transistor 21. The positive terminal of a variable DC voltage source 50 is connected via a resistor 51 to the base electrode of transistor 53, with the junction of resistor 51 and transistor 53 base returned to the grounded negative terminal of source 50 via a diode 52 poled so as to be forward biased by the voltage source 50.

Desirably, each of the diodes 42,43 and 52 comprises an NPN transistor disposed in a diode-connected configuration, with its collector electrode directly connected to its base electrode.

In operation of the illustrated circuit, when the voltage at the positive terminal of source 50 is varied, the biasing of transistor 53 is altered to vary the conductance of its collector-emitter path. The base-emitter path of current source transistor 21 is thus shunted by a DC impedance of a varying magnitude dependent upon the magnitude of the positive voltage applied to resistor 51 by source 50. An increase of the positive voltage decreases the shunting impedance, whereas a decrease of the positive voltage increases the shunting impedance.

The base-emitter path of transistor 31 forms a voltage divider with the parallel combination of (a) the base-emitter path of transistor 21, and (b) the collector-emitter path of transistor 53, to effect a division of the bias voltage appearing across the series-connected diodes 42,43, with the division ratio dependent upon the conductance of transistor 53. When the shunting impedance presented by transistor 53 decreases, the base-emitter voltage ($V_{be}$) of current source transistor 21 decreases, accompanied by a complementary increase of the base-emitter voltage of current source transistor 31. Conversely, when the shunting impedance presented by transistor 53 increases, the $V_{be}$ of transistor 21 increases, accompanied by a complementary decrease of the $V_{be}$ of transistor 31.

The consequence of a variation of the voltage supplied by source 50 is thus an introduction of complementary variations of the operating currents of differential amplifiers 20 and 30, and, hence, complementary variations of the respective gains of the two cascaded stages of the multistage amplifier. With variation of the DC impedance presented by transistor 53 having a negligible effect on the bias voltage appearing across diodes 42, 43, the overall gain of the multistage amplifier, proportional to the product of the magnitudes of the respective stage's operating currents, remains substantially undisturbed as the distribution of gain between the respective stages is varied.

Advantage is taken of the above-described characteristics in the coring circuit described in our aforementioned copending application. In such a use of the present invention, differential amplifiers 20 and 30 serve as cascaded stages of a multistage limiting amplifier, the output of which is combined in antiphasal relationship with the output of a linear amplifier providing a parallel signal translation of input signals from a common source. The overall gain of the limiting amplifier, as determined by the bias voltage established across diodes 42,43 by source 40, is set for equality with the gain of the parallel linear translation path, so that the consequence of the combination of signals is an accurate coring of the input signals. The depth or level of the coring, however, is subject to variation via control of the distribution of gain between the cascaded stages of the limiting amplifier through the agency of variation of the voltage supplied by source 50. A shift of the distribution in the sense that increases the input stage gain reduces the coring level (i.e., lessens the magnitude of the core removed from the input signals), whereas a shift of the distribution in the sense that decreases the input stage gain increase the coring level. With the overall gain of the limiting amplifier, however, substantially undisturbed by the gain distribution variations, the accuracy of the coring is essentially assured at all selected coring levels.

In other applications of the present invention, independent variation of the overall gain of the multistage amplifier may additionally be desired. In such an instance, source 40, for example, may also provide a variable voltage for introduction of overall gain variation. Illustratively, differential amplifiers 20 and 30 may serve as cascaded stages of a multistage IF amplifier in a television receiver, with source 40 constituted by a sync amplitude responsive AGC system. Over some appropriate portion of the AGC control range, source 50 may also be rendered responsive to a voltage derived from the AGC system to relatively shift the focus of gain control action from one stage to another stage. In such operations, the effect of the source 50 variations counters to some desired degree the effect of the source 40 variations on the gain of the one stage, while the effect of the source 50 variations reinforces the effect of the source 40 variations on the gain of the other stage.

In another illustrative use of the present invention, differential amplifiers 20 and 30 may serve as cascaded stages in the chrominance channel of a color television receiver within the loop of a closed loop ACC (automatic chroma control) system, with the ACC voltage responsive to the amplitude of a burst component derived from the output of stage 30. If the chrominance component delivered to the receiver's demodulators is derived from the output of stage 20, rather than stage 30, source 50 may, for example, serve to provide a manual chroma control function, adjusting the magnitude of the delivered chrominance component without disturbance of the ACC loop (since the stage 30 output amplitude is substantially unaffected by the gain distribution variation).

While illustrative uses of the present invention have been described in the specific context of variation of the distribution of gain between two cascaded stages, it will be appreciated that the principles of the present invention may readily be extended to a greater number of cascaded stages.

What is claimed is:

1. An amplifier comprising, in combination:
    first and second signal amplifying stages connected in cascade; and
    means coupled to said first and second signal amplifying stages for simultaneously varying the respective gains of said first and second signal amplifying stages in mutually opposite directions in such manner as to alter the distribution of gain between said stages substantially without disturbance of the overall gain of said amplifier.

2. Apparatus in accordance with claim 1, including a source of DC bias voltage, wherein
    said first signal amplifying stage derives its operating current from the collector electrode of a first current source transistor;
    said second signal amplifying stage derives its operating current from the collector electrode of a second current source transistor; and
    the base-emitter paths of said first and second current source transistors are connected in series-aiding relationship across said source of DC bias voltage; and
    wherein said gain varying means comprises a variable DC impedance coupled across the base-emitter path of one of said current source transistors.

3. An amplifier subject to gain distribution variation, comprising, in combination:
   first and second signal amplifying stages connected in cascade;
   first and second transistors, each having a base electrode; said first signal amplifying stage deriving its operating current from the collector electrode of said first transistor, and said second signal amplifying stage deriving its operating current from the collector electrode of said second transistor;
   a source of DC bias voltage;
   means for forward biasing the base-emitter junctions of said first and second transistors, said biasing means comprising means for connecting the base-emitter paths of said first and second transistors in series-aiding relationship across said bias voltage source; and
   a variable DC impedance coupled across the base-emitter path of one of said transistors.

4. An amplifier subject to gain distribution variation comprising in combination:
   first and second signal amplifying stages connected in cascade;
   first and second transistors, each having a base electrode, an emitter electrode and a collector electrode; said first signal amplifying stage deriving its operating current from the collector electrode of said first transistor, and said second signal amplifying stage deriving its operating current from the collector electrode of said second transistor;
   a source of DC bias voltage;
   means for forward biasing the base-emitter junctions of said first and second transistors, said biasing means comprising means for connecting the base-emitter paths of said first and second transistors in series across said bias voltage source; and
   a variable DC impedance coupled across the base-emitter path of one of said transistors; wherein said variable DC impedance comprises a third transistors; wherein said variable DC impedance comprises a third transistor having base, emitter and collector electrodes; the collector-emitter path of said third transistor being connected in shunt with the base-emitter path of said one transistor.

5. Apparatus in accordance with claim 4 also including:
   a diode connected in shunt with the base-emitter path of said third transistor;
   a variable DC voltage source; and
   means, including a resistor, for providing a direct current conductive coupling between the base electrode of said third transistor and said variable DC voltage source.

6. Apparatus in accordance with claim 5 wherein said bias voltage source comprises a plurality of serially connected semiconductor junctions, with the series combination of a second resistor and a source of DC potential connected in shunt with said plurality of serially connected semiconductor junctions.

7. Apparatus in accordance with claim 6 wherein said first signal amplifying stage comprises fourth and fifth transistors, each having base, emitter and collector electrodes; with the emitter electrodes of said fourth and fifth transistors connected in common to the collector electrode of said first transistor; and wherein said second signal amplifying stage comprises sixth and seventh transistors, each having base, emitter and collector electrodes, with the emitter electrodes of said sixth and seventh transistors connected in common to the collector electrode of said second transistor.

8. Apparatus in accordance with claim 7 wherein a source of signals to be amplified is coupled between the base electrodes of said fourth and fifth transistors; wherein the base electrodes of said sixth and seventh transistors are driven in push-pull by amplified signals appearing at the collector electrodes of said fourth and fifth transistors; and wherein push-pull output signals are derived from the collector electrodes of said sixth and seventh transistors.

9. Apparatus in accordance with claim 8 wherein said one transistors is said first transistor, and wherein said second resistor is connected between said DC potential source and the base electrode of said second transistor.

10. An amplifier subject to gain distribution variation, comprising, in combination:
   first and second signal amplifying stages connected in cascade;
   first and second transistors of like conductivity type, each having base, emitter and collector electrodes; said first signal amplifying stage deriving its operating current from the collector electrode of said first transistor, and said second signal amplifying stage deriving its operating current from the collector electrode of said second transistor;
   a source of DC bias voltage;
   means for forward biasing the base-emitter junctions of said first and second transistors, said biasing means comprising means, including a direct connection between the emitter electrode of one of said first and second transistors and the base electrode of the other of said first and second transistors, for connecting the base-emitter paths of said first and second transistors in series-aiding relationship across said bias voltage source;
   a third transistor having base, emitter and collector electrodes; the collector-emitter path of said third transistor being connected in shunt with the base-emitter path of said other of said first and second transistors; and
   means for varying the biasing of the base-emitter path of said third transistor so as to cause opposite variations in said operating currents in such manner as to alter the distribution of gain between said first and second amplifying stages substantially without disturbance of the overall gain of said amplifier.

* * * * *